United States Patent [19]

Weiher et al.

[11] 4,181,627

[45] Jan. 1, 1980

[54] HIGH FLUORESCENT EFFICIENCY ZINC OXIDE CRYSTALS AND METHOD OF MAKING SAME

[75] Inventors: Richard L. Weiher, Hudson Twp., ST. Croix County, Wis.; Gerhard W. Voll, Moundsview; Kjell I. Hagemark, Norway, both of Minn.

[73] Assignee: Minnesota Mining and Manufacturing Company, St. Paul, Minn.

[21] Appl. No.: 551,057

[22] Filed: Feb. 19, 1975

Related U.S. Application Data

[63] Continuation of Ser. No. 291,023, Sep. 21, 1972, abandoned.

[51] Int. Cl.² ................... C09K 11/26; C09K 11/10
[52] U.S. Cl. .................... 252/301.6 R; 252/301.6 S; 252/62.3 ZT
[58] Field of Search ............. 252/301.6 R, 301.6 S, 252/62.3 ZT; 423/622, 623

[56] References Cited

U.S. PATENT DOCUMENTS

| | | | |
|---|---|---|---|
| 2,529,711 | 11/1950 | Smith | 252/301.6 S |
| 2,573,817 | 11/1951 | Thomsen | 252/301.6 S |
| 3,534,211 | 10/1970 | Lehmann | 252/301.6 R |
| 3,567,373 | 3/1971 | Hutson et al. | 423/623 |
| 3,671,193 | 6/1972 | Jaskolski et al. | 423/622 |

OTHER PUBLICATIONS

Thomas "J. Phys. Chem. Solids", vol. 3, pp. 229–237, 1957.

*Primary Examiner*—Jack Cooper
*Attorney, Agent, or Firm*—Cruzan Alexander; Donald M. Sell; William B. Barte

[57] ABSTRACT

Single crystals of zinc oxide which efficiently fluoresce in the near UV due to the radiative recombination of free excitons. Increased efficiency is attributed to treatment of the crystals to optimize the concentration of free excitons by providing donors to compensate an as-grown concentration of acceptors of less than 10 parts per million.

4 Claims, No Drawings

HIGH FLUORESCENT EFFICIENCY ZINC OXIDE CRYSTALS AND METHOD OF MAKING SAME

This is a continuation of application Ser. No. 291,023 filed Sept. 21, 1972, now abandoned.

FIELD OF THE INVENTION

This invention relates to high efficiency violet and near ultraviolet fluorescing material and to a method for producing such material.

BACKGROUND OF THE INVENTION

High energy violet or shorter wavelength light, i.e. in excess of 3.0 electron volts, cannot be produced by most fluorescing semiconductors, which typically have bandgaps too narrow to accommodate a radiative transition producing violet or shorter wavelength light. Nonetheless, an efficient producer of such short wavelength light has long been sought, in order to provide a full spectrum of fluorescent colors and to provide energetic light which is readily and desirably used in conjunction with optical systems having an optimum sensitivity to higher energy photons.

Because zinc oxide has a band-gap of 3.3 electron volts at 300° K., it has been intensively studied as a potential source of violet light. Zinc oxide has found practical use as a luminescent powder, which when activated by the addition of certain impurities, efficiently emits green light upon stimulation by energy in excess of the band-gap of zinc oxide. Such emission is believed to result from radiative transitions associated with localized luminescent centers within the forbidden gap arising from the introduction of the impurities. Efficient production of shorter wavelength fluorescence resulting from radiative transitions nearly equal to the band-gap of zinc oxide has heretofore been reported only in zinc oxide powders or minute single crystals. Attempts by others to efficiently produce near ultraviolet emission in large single crystals of zinc oxide have been unsuccessful.

The UV excited fluorescent efficiency of large zinc oxide crystals as grown via vapor phase techniques is typically less than 0.0001 in the near UV when measured at 77° K., and is generally a factor of 50-100 times lower at room temperature.

We have previously observed during investigation of a large number of such zinc oxide crystals a very rare and unpredictable occurrence of near UV fluorescence at an efficiency as high as 0.02 at 77° K. Furthermore, such fluorescence is extremely non-uniform, and varies by a factor of a hundred or more throughout the crystal. Such occurrence has never been exploitable due to the rare and non-uniform nature of the emission. Large crystals grown by all other known methods, such as hydrothermally produced crystals, are substantially less efficient due to large concentrations of hole trapping centers, such as foreign as well as native acceptors, dislocations, etc., introduced by the presence of such acceptor-providing materials as Li, during growth.

SUMMARY OF THE INVENTION

For the first time, highly efficient, relatively large single crystal fluorescent sources of near ultraviolet light have been intentionally produced. Such single crystals, unlike their luminescent powder counterparts, are useful in semiconductor light emitting devices such as lasers and light emitting diodes. We have discovered that a high purity single crystal of zinc oxide of sufficient size to be useful in solid state semiconducting devices, such as having a minimum dimension of at least 0.1 mm, and having a concentration of acceptors less than about 10 parts per million will readily and uniformly fluoresce in the crystal in the near ultraviolet with an efficiency of at least 0.001, measured at 77° K., when donors are present in a concentration not exceeding 20 parts per million, but sufficient to compensate the acceptor concentration.

The term "to compensate", as used herein, means that sufficient donors are introduced to enhance the probability of forming excitons when the donors are ionized to supply free electrons in preference to the capture of free holes by acceptors.

Such high efficiency zinc oxide crystals are prepared by heating a zinc oxide crystal having a concentration of acceptors less than about 10 parts per million in the presence of an donor-providing material selected from the group consisting of Zn, ZnS, CdS, S, $In_2O_3$, $In(NO_3)_3$, Ga and $H_2$ to introduce into the crystal the necessary concentration of donors as described hereinabove. In a preferred embodiment, a crystal is heated together with zinc sulfide powder to a predetermined temperature for a time sufficient to allow zinc produced by the dissociation of the zinc sulfide and by the reaction between the zinc oxide and sulfur to uniformly diffuse throughout the crystal. After heating, the crystal is quenched to room temperature, thereby rapidly decreasing the ease with which the donor providing materials diffuse throughout the crystal, thus freezing in the donors within the crystal. The zinc sulfide treatment is similar to that used with zinc oxide powder to enhance green luminescence, and may produce a similar green luminescent enhancement in the outer layer of crystals so treated. Thus the near UV fluorescence produced in the interior of the crystal may be masked by such a green fluorescing outer layer. In this embodiment, therefore, it is preferable to remove the outer layer by conventional mechanical methods followed by a chemical etch using dilute mineral acids or by a chemical etch alone. Such dilute acids include $H_3PO_4$, $H_2SO_4$, $HNO_3$ and HCl, in greater than 10% concentration to provide a relatively undamaged crystalline surface.

The treated crystals may be fabricated into semiconductive light emitting devices and stimulated to produce useful quantities of near ultraviolet light both at cryogenic and at room temperatures, which light is optimum for use with many optical systems having a natural high sensitivity to the energetic photons thus emitted.

The fluorescence produced in zinc oxide crystals upon radiative recombination of electrons and holes is commonly separated into two spectral regions, the near ultraviolet, i.e. below 4000 Å, and green, i.e. between 4500–6000 Å. Production of the green spectra requires introducing an activator and possibly a co-activator into the zinc oxide, and is, therefore, designated as "extrinsic" emission since the emission results from the electron-hole recombination at defects. The near UV spectra is characterized by the presence of many emission bands, the production of which is attributed to the radiative annihilation of excitons, i.e. electron-hole pairs. Some of these emission bands are due to the annihilation of "bound" excitons, that is, excitons that are bound to some native or foreign defect by coulombic attraction. Such bands are also included in the designation of "extrinsic" emission. The remainder of the emission bands in the near UV are attributed to the radiative annihilation of free excitons and have energies associated with the energy of the gap between the valence and conduction band less the binding energy of the electron-hole pair.

A free exciton is an excited state in a crystalline solid having an electron and a hole in orbit about each other at distances large compared with atomic dimensions, wherein the coulomb attraction between each pair of electrons and holes is sufficient to form a stable state. The free excitons are able to move through the crystal and can, therefore, transport energy, but because they are overall neutral, cannot transport charge. The radiative annihilation may occur with or without the simultaneous emission of longitudinal optical phonons, and is designated as intrinsic or free exciton emission which is believed responsible for the enhanced near UV fluorescence discussed herein.

The high efficiency crystals discussed herein are those in which the concentration of free electrons is controlled so as to increase the probability of the forming of free excitons as opposed to the trapping of holes by either native or foreign acceptors. We believe that three competing processes occur in such crystals upon excitation by energy in excess of the band-gap of the crystals. These include hole trapping by acceptors, formation of free excitons and formation of excitons bound to native or foreign defects. Since the near UV fluorescence results from radiative recombination of free excitons, we have discovered that the near UV fluorescence will be increased by treating the crystal to maximize the formation of free excitons. The zinc oxide crystals must be treated to provide an optimum donor concentration which introduces free electrons of sufficient quantity to overcome the hole trapping mechanism before bound excitons become predominant.

External fluorescent efficiency as used herein is the ratio of measured fluorescent energy to the measured excitation energy. One technique for determining the efficiency is based on the use of a diffuse reflector such as a pressed slab of magnesium oxide (MgO), wherein it is assumed that the diffuse reflector scatters light in the same radial pattern as that produced by a fluorescing crystal of zinc oxide and that substantially 100% of light directed onto the diffuse reflector is reflected therefrom. The technique is as follows:

Step One: Collimated light from a tungsten source regulated to provide a constant light output is directed onto a diffuse reflector (i.e., a slab of pressed MgO powder). A portion of the reflected light is passed through an entrance slit of a Perkin Elmer, Inc. Model 350 Spectrophotometer, to provide a graphic display of the intensity of the source as a function of wavelength, in which the area under the curve, $A_{MgO}$, is a measure of the power of the tungsten lamp.

Step Two: The diffuse reflector is replaced with a calibrated thermopile, and the power output of the lamp, $P_{tungsten\ lamp}$, is determined. The measured power is substantially equal to $A_{MgO}$. I.E., $$\left(\frac{A_{MgO}}{P_{Tungsten\ lamp}}\right) \cdot f = \text{Eff}_{MgO} \approx 100\%, \text{ where}$$

$\text{Eff}_{MgO}$ = effective efficiency of MgO
f = normalizing factor determined so that $\text{Eff}_{MgO}$ = 100%.

Step Three: The tungsten lamp is then replaced with an ultraviolet source and a section of a coated sheet of high efficiency zinc oxide powder in a binder such as styrene-butadiene is substituted for the diffuse reflector (MgO). The fluorescent powder, $A_{ZnO\ sheet}$, of the sheet is then determined with the spectrophotometer as being equal to the area under the intensity vs. wavelength curve provided by the spectrophotometer.

Step Four: The zinc oxide sheet is next replaced with the calibrated thermopile and the power output of the UV source, $P_{UV\ source}$, is likewise determined. The external fluorescent efficiency of the zinc oxide sheet, $\text{Eff}_{ZnO\ sheet}$, is then determined as follows:

$$\text{Eff}_{ZnO\ sheet} = \frac{A_{ZnO\ paper}/P_{UV\ source}}{A_{MgO}/P_{tungsten\ lamp}}$$

Step Five: The zinc oxide sheet is thereafter used as a standard against which comparative determinations of the efficiency of crystals may be made. By using the same UV source positioned exactly as it was when determining the fluorescent power of the zinc oxide sheet, by replacing the ZnO sheet with a zinc oxide crystal and by determining the fluorescent power of the crystal, $A_{ZnO\ crystal}$, as the area under the intensity vs. wavelength curve produced on the spectrophotometer, the external fluorescent efficiency of the crystal may then be calculated as follows:

$$\text{Eff}_{ZnO\ crystal} = \left(\frac{A_{ZnO\ crystal}}{A_{ZnO\ sheet}}\right) \cdot \text{Eff}_{ZnO\ sheet}$$

DESCRIPTION OF THE PREFERRED EMBODIMENT

The present invention is directed to a zinc oxide crystal treated to efficiently produce near ultraviolet (UV) light in preference to the more commonly observed green emission and to maintain the efficiency such that it decreases very litle at room temperature. The treatment of the crystal to enable efficient emission of near UV light preferably comprises heating the crystal in the presence of a donor-providing material to introduce into the crystal a concentration of donors sufficient to compensate such acceptors as may be present in concentrations less than about 10 parts per million. Crystals having efficiencies as high as 0.12 have been produced by this method.

The examples set forth hereinbelow are only illustrative of types of donor-providing materials with which zinc oxide crystals may be treated to modify the fluorescent efficiency. A large number of materials are known to those skilled in the art which may act as donors when appropriately introduced into zinc oxide crystals, and are intended to be within the scope of this invention. For example, it is known that native defects, vacancies and the like, as well as the introduction of foreign materials, may act as donors. Typical foreign donor-providing materials include Zn, ZnS, CdS, S, compounds of In, such as $In_2O_3$ and $In(NO_3)_3$, Ga and $H_2$. Similarly, modifications of crystal growth techniques such that donors in the concentrations disclosed herein are introduced during growth, rather than requiring a separate post-growth operation, are within the scope of the present invention.

EXAMPLE 1

A 2 mm thick section of an as-grown hexagonal zinc oxide crystal 7 mm across opposite faces, obtained from and produced via conventional vapor phase techniques under controlled conditions to produce crystals having a concentration of acceptors less than about 10 parts per million, was first selected. The crystal was tested and found to have an external fluorescent efficiency in the near UV (i.e. at 3750 Å) at 77° K. of 0.0007. The crystal was then placed in a crucible and covered with zinc sulfide powder. The crucible was then covered, inserted in a preheated furnace at 1000° C. for 3 hours, after which it was removed and quenched to room temperature.

The temperature, time of heating, quenching rate, size of the crucible and furnace and other physical constraints are not very critical. Temperatures ranging from 850° to 1500° C. have been successfully used, however approximately 1000° C. is preferable for use with crystals in the size range used in this example. The diffusion rate of zinc is a function of temperature, thus for thicker crystals, either the time of treatment must be longer or the temperature increased. The upper temperature limit is set by the sublimation temperature of zinc oxide, and the lower temperature limit is set by the diffusivity of zinc in zinc oxide. Large zinc oxide crystals on the order of 1 cm can be easily and uniformly so treated in less than 30 minutes at 1000° C. Similarly, very little difference has been found in the results for different brands (or particle sizes) of zinc sulfide powder.

The observable fluorescence after quenching is primarily the green emission, with generally very little near UV emission. After removing a thin outer layer from the crystal by polishing, i.e. grinding and etching or by etching alone, it has been found that the interior of the crystal exhibits very efficient and uniform near UV emission, with very little green emission.

In this example, after grinding and then etching the crystal in a 30% solution of $H_3PO_4$ to remove the outer layer, the near UV external fluorescent efficiency of the crystal was again measured and determined to be 0.11 at 77° K. and 0.017 at 300° K. The electron concentration was determined to be about $2 \times 10^{17}/cm^3$ at 300° K., which is equivalent to a donor concentration of 5–20 parts per million depending upon the concentration of acceptors present. Like equivalent donor concentrations were observed in the subsequent examples recited herein. The extent of grinding and etching or like treatment to remove the outer layer is empirically terminated when no further increase in the external fluorescent efficiency is observed.

EXAMPLE 2

Another 2 mm thick section of an as-grown hexagonal zinc oxide crystal, 6 mm across opposite faces, produced and tested as set forth in Example 1, was first determined to have an external fluorescent efficiency in the near UV of 0.00037 at 77° K. and $2 \times 10^{-8}$ at room temperature. The crystal was then heated together with zinc sulfide powder in a covered crucible at 1000° C. for 13 hours, quenched to room temperature, polished and etched as in Example 1. The near UV external fluorescent efficiency after treatment was 0.062 at 77° K. and 0.003 at room temperature.

EXAMPLE 3

Another 2 mm thick vapor phase grown zinc oxide crystal, obtained and tested in the same manner as set forth in Example 1, was first determined to have a near UV external fluorescent efficiency of approximately 0.0004 at 77° K. and 0.000008 at room temperature. The crystal was then placed in one end of a small quartz ampule, zinc metal was placed in the other end. The ampule was evacuated and sealed. Such a sealed system is used to control the zinc partial pressure and to prevent the burn-up of the zinc. The ampule and contents were then heated at 700° C. for 7 days, quenched to room temperature, and polished and etched as in Example 1. The near UV external fluorescent efficiency after treatment was determined to be approximately 0.032 at 77° K. and 0.0022 at room temperature.

The time and temperature conditions for use with zinc vapors are more critical than with the zinc sulfide embodiment. The concentration of excess zinc that diffuses into the zinc oxide crystal is determined by both the diffusion constant of zinc in zinc oxide, and by the vapor pressure of zinc, both of which increase with temperature. The optimum temperature has been found to be in the range of 650°–700° C., but because the rate of zinc diffusion is so low at these temperatures, the time of treatment is substantially longer than that required with the zinc sulfide treatment. For example, approximately 7 days are needed to uniformly treat a zinc oxide crystal slab several millimeters thick. The thickness of the crystal slab is the important criteria in determining the time required for uniform treatment. The time required is generally proportional to the square of the thickness. By placing the crystal and zinc powder at opposite ends of the ampule, the crystal may be heated to the same or higher temperature than the zinc, thereby enabling one to vary the concentration of excess zinc introduced into the zinc oxide crystals by several orders of magnitude.

EXAMPLE 4

A zinc oxide crystal wafer, 0.3 cm by 0.7 cm by 0.5 cm, cut from a large vapor phase grown crystal obtained and tested in the same manner as set forth in Example 1 was first determined to have a near UV external fluorescent efficiency of 0.00014 at 77° K. The wafer was placed in a crucible and covered with cadmium sulfide. The crucible was covered, placed in a preheated oven at 1000° C. for 30 minutes, and quenched to room temperature. After polishing and etching in the same manner set forth in Example 1, the near UV external fluorescent efficiency was again measured at 77° K. and found to be 0.024.

EXAMPLE 5

A zinc oxide crystal wafer 0.15 cm by 0.7 cm by 0.6 cm cut from a large vapor phase grown crystal obtained and tested in the same manner as set forth in Example 1 was first determined to have a near UV external fluorescent efficiency at 77° K. of approximately 0.00002. The wafer was placed in a crucible and covered with sulfur powder until the crucible was approximately two-thirds full. The crucible was covered, placed in an oven at 980° C. for approximately 4 minutes, and quenched to room temperature. After polishing and etching as set forth in Example 1, the near UV external fluorescent efficiency at 77° K. was approximately 0.02.

EXAMPLE 6

A zinc oxide crystal wafer 0.15 cm by 0.5 cm by 0.7 cm cut from a large vapor phase grown crystal obtained and tested in the same manner as set forth in Example 1 was first determined to have a near UV external fluorescent efficiency at 77° K. of about 0.00002. The crystal was then placed in a crucible with gallium metal. The crucible was covered, placed in an oven for 870° C. for 18 hours and quenched to room temperature. After polishing and etching, the near UV external fluorescent efficiency at 77° K. was approximately 0.012.

EXAMPLE 7

A zinc oxide crystal wafer 0.05 cm by 0.8 cm by 0.3 cm cut from a large vapor phase grown crystal obtained and tested in the same manner as set forth in Example 1 was first determined to have a near UV external fluorescent efficiency at 77° K. of 0.0004. The wafer was placed in a crucible and covered with indium oxide powder. The crucible was then covered, placed in an oven at 1250° C. for 4 hours and quenched to room temperature. The crystal was then heated in air at 850° C. for 96 hours and quenched to room temperature. After polishing and etching, the near UV external fluorescent efficiency at 77° K. was determined to be approximately 0.0024.

EXAMPLE 8

A zinc oxide crystal wafer 1.8 mm by 1.8 mm by 13 mm cut from a large vapor phase grown crystal obtained and tested in the same manner as set forth in Example 1 was first determined to have a near UV external fluorescent efficiency at 77° K. of approximately 0.010. The crystal was then placed in an $Al_2O_3$ crucible, covered with zinc oxide powder, and inserted in an autoclave. The crystal was heated for 30 minutes at 400° C. in 90 atmospheres of hydrogen gas and rapidly cooled to room temperature. After polishing and etching as in Example 1, the near UV external fluorescent efficiency at 77° K. was again measured and determined to be approximately 0.032.

Having thus described the present invention, what we claim is:

1. A method of treating a high purity single crystal of zinc oxide characterized by a minimum dimension of at least 0.1 mm and having a concentration of acceptors less than about 10 parts per million, which method comprises
    heating the crystal in the presence of a donor-providing material selected from the group consisting of Zn, ZnS, CdS, S, $In_2O_3$, $In(NO_3)_3$, Ga and $H_2$ for a time and at a temperature sufficient to allow homogeneous and uniform diffusion throughout the crystal of a concentration of donors sufficient to compensate said acceptor concentration but not exceeding 20 parts per million, thereafter rapidly cooling said crystal to keep substantially all of the uniformly diffused donors homogeneously distributed in the interior of the crystal, followed by removing a thin outer layer of said rapidly cooled crystal to give the crystal a high external fluorescent efficiency in the near ultraviolet of at least 0.001 when measured at 77° K. and to enable said crystal to exhibit uniform fluorescence in the interior of the crystal.

2. A method according to claim 1, wherein said removing comprises mechanically polishing a surface of the crystal followed by etching the polished surface.

3. A method of solid state doping a zinc oxide single crystal having a minimum dimension of at least 0.1 mm and having a concentration of acceptors less than about 10 parts per million, which method comprises heating said zinc oxide crystal together with zinc sulfide powder to a predetermined temperature between 850° C. and 1500° C., for a time sufficient to allow homogeneous diffusion of zinc throughout the crystal; quenching said heated crystal to room temperature, and removing a thin outer layer from said crystal to give the crystal a high external fluorescent efficiency in the near ultraviolet of at least 0.001 when measured at 77° K. and to enable said crystal to exhibit uniform fluorescence in the interior of the crystal.

4. A method according to claim 3, comprising heating a said zinc oxide crystal having a thickness of about 2 millimeters together with a quantity of zinc sulfide powder in a covered crucible to a predetermined temperature of about 1000° C. for at least 3 hours.

* * * * *